United States Patent [19]
Washizaki et al.

[11] Patent Number: 5,240,545
[45] Date of Patent: Aug. 31, 1993

[54] BASE PLATE CONVEYOR

[75] Inventors: Yoji Washizaki; Shigeo Sumi, both of Saitama, Japan

[73] Assignee: Somar Corporation, Tokyo, Japan

[21] Appl. No.: 778,380

[22] Filed: Oct. 17, 1991

[30] Foreign Application Priority Data

Oct. 17, 1990 [JP] Japan .................. 2-279603

[51] Int. Cl.⁵ .............................. B32B 31/18
[52] U.S. Cl. .................... 156/360; 156/522; 156/552; 156/555; 156/556; 198/502.2
[58] Field of Search .............. 156/552, 521, 517, 522, 156/360, 555; 198/456, 449, 444, 452, 502.2, 624; 271/262, 263

[56] References Cited

U.S. PATENT DOCUMENTS

| | | | |
|---|---|---|---|
| 4,770,737 | 9/1988 | Seki | 156/584 |
| 4,844,772 | 7/1989 | Sumi et al. | 156/497 |
| 4,867,836 | 9/1989 | Hamamura et al. | 156/584 |
| 4,961,803 | 10/1990 | Hamamura et al. | 156/238 |
| 5,010,999 | 4/1991 | Candore | 198/456 |

FOREIGN PATENT DOCUMENTS 0220661 5/1987 European Pat. Off. .

Primary Examiner—David A. Simmons
Assistant Examiner—J. Sells
Attorney, Agent, or Firm—Sughrue, Mion, Zinn, Macpeak & Seas

[57] ABSTRACT

A base plate conveyor for conveying a base plate in a film adhering and peeling apparatus. The conveyor include a plurality of rollers which are capable of conveying the base plate between processing members disposed on opposite sides of the base plate. The base plate is capable of being positioned such that the center of the base plate coincides with the center point between the processing units, regardless of the thickness of the base plate. The conveyor further includes a mechanism for adjusting the transverse position of the base plate with respect to the direction of conveyance thereof. Also provided is a mechanism for applying an air bubble preventive agent to the base place such that air bubbles do not form between the base plate and the film adhered thereto.

16 Claims, 11 Drawing Sheets

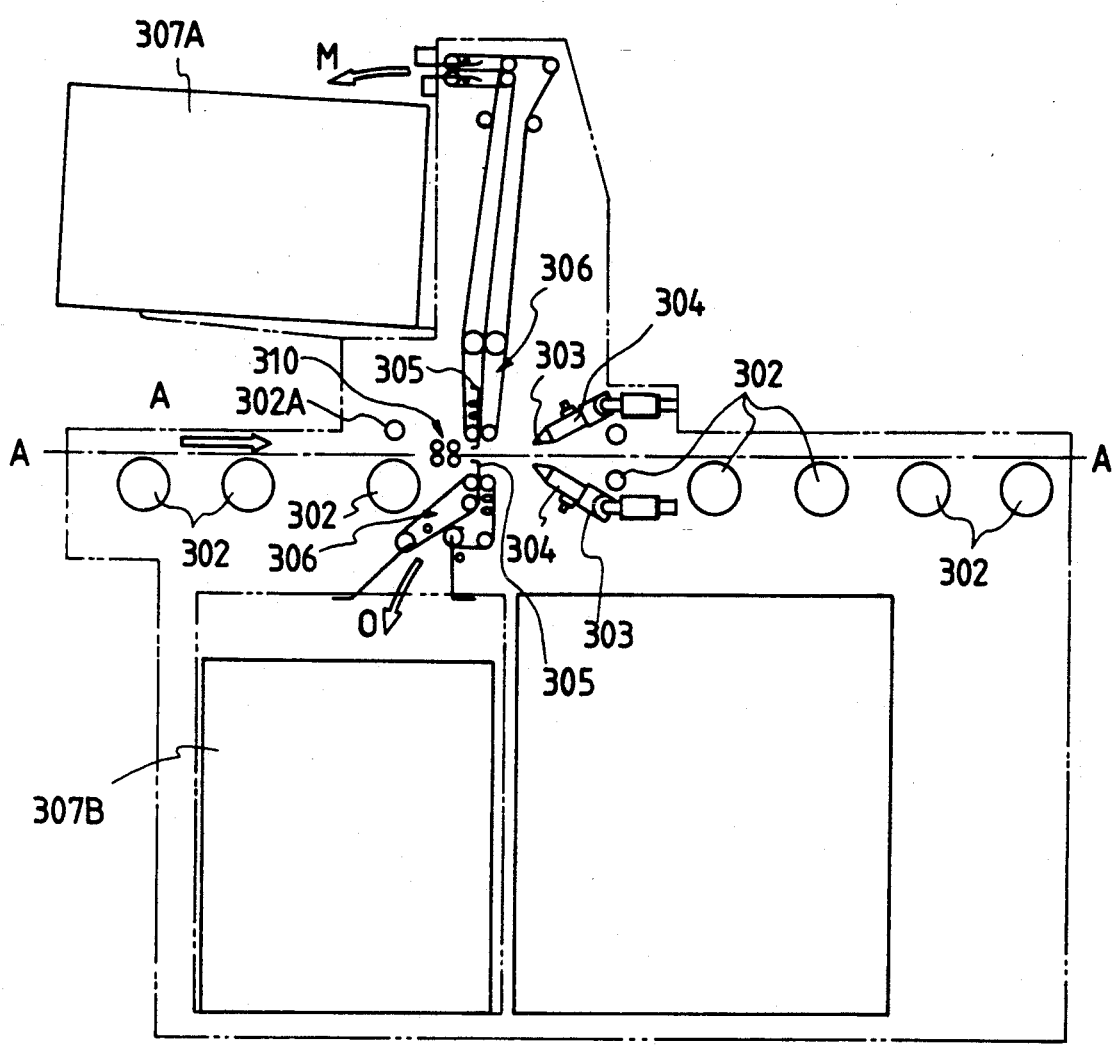

BASE PLATE CONVEYOR

BACKGROUND OF THE INVENTION

1. Field of Invention

The present invention relates to a base plate conveyor for a film adhering apparatus, and more particularly relates to a base plate conveyor which automatically places the base plate in a prescribed position between two processing units.

2. Background

A conventional base plate conveyor having a base plate sideward movement mechanism is used for a film adhering apparatus, a film peeling apparatus or the like.

With the recent introduction of techniques for providing multiple layers on a base plate, the thickness of the base plate and the intricacy of the wiring pattern thereon have increased. An automatic film adhering apparatus which has a base plate conveyor and which adheres a photoresist film to both sides or one side of the base plate has been proposed. Further, an automatic film peeling apparatus which has a base plate conveyor and which peels the cover film of an adhered photoresist film from the base plate has also been proposed. In these apparatus, when the base plate is conveyed to a prescribed position, lower and upper film processing members are synchronously moved up and down from their original positions toward the base plate to perform processing on upper and the lower films on the base plate. In the automatic film adhering apparatus, the processing members are film adhering members such as rollers or the like. In the automatic film peeling apparatus, the processing members are film loosening members.

If the conveyance plane of the base plate conveyor of the automatic film adhering and peeling apparatus is preset to a position 0.5 mm below the center point between the upper and lower film processing members so that the center of thickness of a 1 mm thick base plate, for example, coincides with the center point, the center of the thickness of a base plate of 11 mm in thickness deviates by a distance of 5 mm from the center point. Therefore, a distance between an upper surface of the base plate and an upper processing member such as an upper pressure applying roll of the film adhering apparatus, an upper film peeling pawl of the automatic film peeling apparatus disclosed in U.S. Pat. No. 4,867,836 and an upper vibrating pen of the automatic film peeling apparatus disclosed in U.S. Pat. No. 4,770,737 becomes different from a distance between a lower surface of the base plate and a lower processing member. This presents a problem in that processing of the films on the base plate is not precisely performed under the same conditions for both sides of the base plate. To solve this problem, the position of the base plate conveyor as a whole or the height of the base plate conveyance plane of the conveyor must be adjustable so that the center of thickness of the conveyed base plate can be adjusted to coincide with the center point between the upper and the lower film processing members.

The present invention was made in order to solve this problem. Accordingly, it is an object of the present invention to provide an apparatus which automatically positions the center of the base plate to coincide with the center point between the processing units, regardless of the thickness of the base plate.

It is another object of the present invention to provide an apparatus which automatically positions the center of the base plate to coincide with the center point between the upper and the lower film processing units of an automatic film adhering or peeling apparatus when conveying the base plate by a base plate conveyor.

It is yet another object of the present invention to provide an apparatus which precisely adheres photoresist films to both sides of a base plate under the same conditions.

It is yet another object of the present invention to provide an apparatus in which an air bubble preventive agent for improving the adherence of the films to the base plate is applied to both sides of the base plate before the films are adhered to the base plate.

The above-mentioned and other objects and novel features of the present invention will be apparent through the examination of the description herein and the drawings attached hereto.

SUMMARY OF THE INVENTION

According to the present invention, the following features attain the objectives outlined above.

A base plate conveying apparatus according to the present invention, for conveying a base plate from an inlet conveyor conveying the base plate on the basis of one surface of the base plate, to a processing unit processing the base plate on the basis of a center of a thickness of the base plate, the apparatus characterized by comprising: base plate holding means for holding-down the base plate positioned on the inlet conveyor; and base plate position correcting means for clamping the base plate from both sides of the base plate so as to coincide the center of the thickness of the base plate with a center of the processing unit. As a result, regardless of the thickness of the base plate, the center of the thickness of the base plate can be automatically positioned so as to be coincident with the center of the processing unit.

The base plate holding means preferably includes a holding roller for depressing the base plate from one side of the base plate, and a cylinder for moving the holding roller toward the base plate to depress the base plate. This represents a simple construction of the base plate holding means.

The holding roller is preferably a rubber roller having a tracking function so that another separate tracking roller can be dispensed with.

The base plate position correcting means preferably includes at least a pair of nip rollers for clamping the base plate from both sides of the base plate and synchronously driving means for synchronously moving the nip rollers from both sides of the base plate toward the base plate to depress the base plate. This represents a simple construction of the base plate position correcting means.

At least one of the nip roller preferably serves for the holding roller of the base plate holding means so that a separate holding roller can be dispensed with.

The nip roller serving for the holding roller is preferably disposed at a processing unit side. As a result, even if the base plate is small in size, the small base plate can be conveyed and tracked to a next step while being held down.

The holding means and the correcting means are preferably operated such that the nip roller serving for the holding roller is moved toward the base plate for depressing the base plate being conveyed by the inlet conveyor, and then all of the nip rollers including the nip roller serving for the holding roller are synchronously moved toward the base plate from both sides thereof so as to coincide the center of the thickness of the base plate with the center of the processing unit while decreasing a depressing force of the nip roller serving for the holding roller. As a result, holding the base plate and correcting the position of the base plate can be surely performed with a simple operation.

Roller support members supporting the nip rollers and synchronously depressing the nip rollers from both sides of the base plate toward the base plate in a base plate position correcting state is preferably designed so as to allow the movement of the nip roller serving for the holding roller toward the base plate when the nip roller serves for the holding roller. An interference between the base plate holding and the base plate position correcting can be prevented with a simple construction.

The synchronously driving means is preferably a pneumatic hand of a rack and parallel type, so that the synchronous movement of pneumatic hand can be easily performed.

The rollers are preferably driven to rotate by a belt having teeth. Even if the positions of the rollers are changed for the base plate holding operation and the base plate position correcting operation, the roller can be surely driven.

The position of the center of the processing unit is deviated farther from the inlet conveyor than the center of the thickness of the most thick base plate positioned on the inlet conveyor.

The base plate sideward moving means for moving the base plate in a width direction thereof and positioning the base plate at a suitable position for holding-down the base plate by the base plate holding means is preferably disposed at an upstream of the apparatus relative to the base plate holding means. With this arrangement, the base plate sideward movement operation can be easily performed. On the contrary, if the base plate sideward movement operation is performed after the base plate is held down, such operation becomes complicated.

The processing unit preferably processes both surfaces of the base plate simultaneously. As a result, the processing on both surfaces of the base plate can be simultaneously performed. Thus, working efficiency can be increased.

The processing unit may be a laminator for pressure-adhering the film onto the base plate. Since the center of the thickness of the base plate is correctly positioned to be coincident with the center of the laminator, i.e. the center between upper and lower pressure-adhering rollers, the films can be surely adhered onto both surfaces of the base plate in the same condition for both surfaces thereof.

Void preventing agent application means for applying a void preventing agent onto the base plate before the film is adhered thereto is preferably provided. As a result, the film can be adhered onto the base plate without wrinkles and void spaces. In addition, the void preventing agent application means are selectively operated in ON and OFF state, so as to prevent wear of the means.

The processing unit may be a peeler for peeling a film adhered onto the base plate therefrom. Since the center of the thickness of the base plate onto which the films are adhered is correctly positioned to be coincident with the center of the peeler, i.e. the center of the upper and lower film end raising pawls and/or the center of the upper and lower vibrating pens, so that the films can be peeled from the base plate in the same condition for both surfaces of the base plate.

BRIEF DESCRIPTION OF THE DRAWINGS

FIG. 11 is an explanatory view to explain an embodiment in which the present invention is applied to a film peeling apparatus.

DETAILED DESCRIPTION OF THE PREFERRED EMBODIMENTS OF THE INVENTION

An embodiment of the present invention is hereafter described in detail with reference to the drawings attached hereto.

Figure 2:
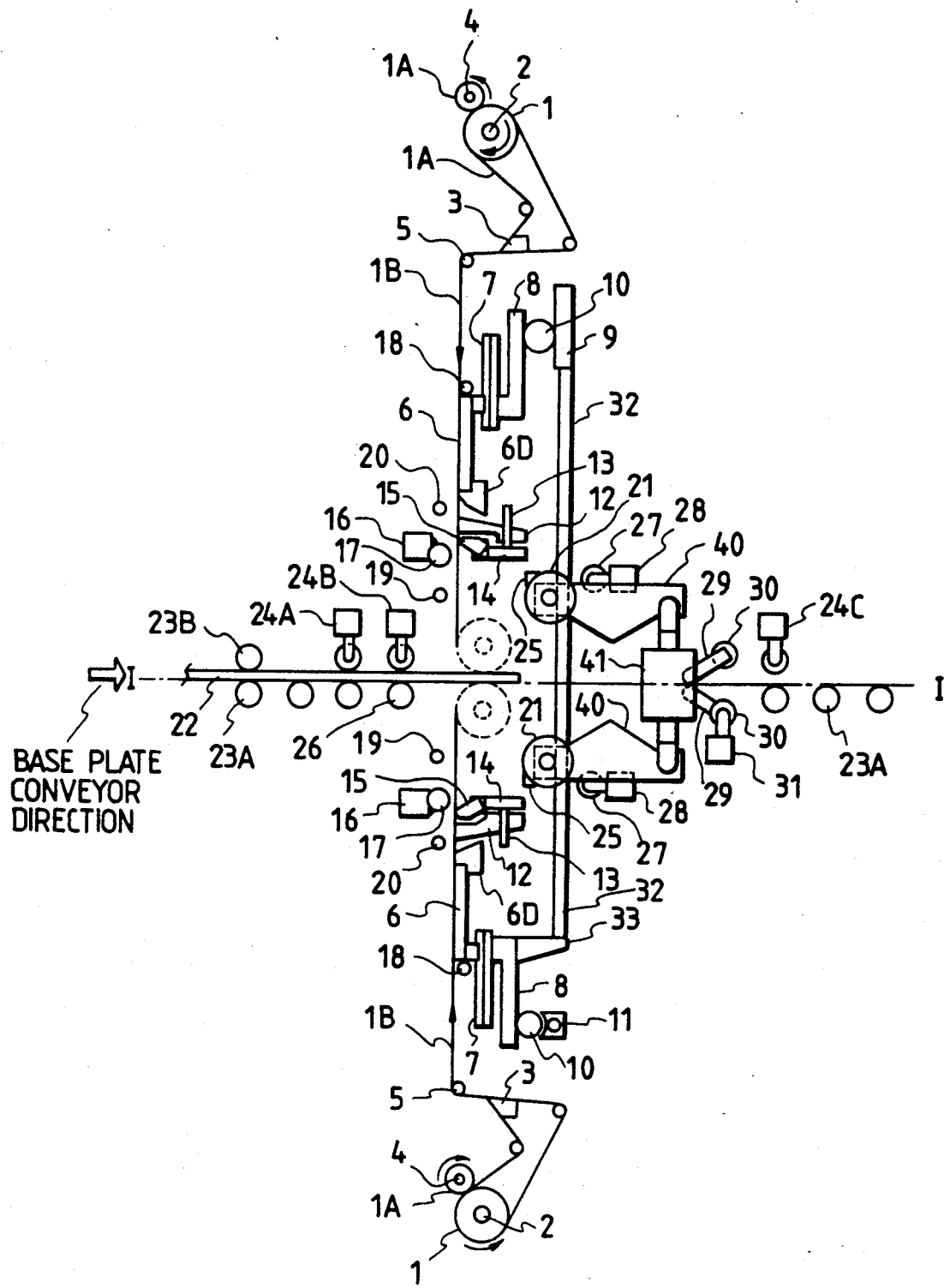
FIG. 2 is a schematic view of the apparatus.

As shown in FIG. 2, stratified films 1, each of which consists of three layers, a light-transmissible resin film, a photosensitive resin layer and another light-transmissible resin film, are continuously wound on upper and lower supply rollers 2 in advance. Each of the stratified films 1 is divided, by a film separator 3, into the light-transmissible resin film IA, which is a protective film, and a stratified film 1B consisting of the other light-transmissible resin film and the photosensitive resin layer exposed on one side thereof, which is to be adhered to base plate 22, as described below. Each of the light-transmissible resin films 1A is separated from the stratified film 1B and is wound on a winding roller 4 while the stratified film IB is simultaneously conveyed toward the base plate 22. Upper supply roller 2 and winding roller 4 are disposed above the base plate conveyance passage I—I while corresponding lower supply roller 2 and winding roller 4 are disposed below the base plate conveyance passage I—I.

The leading edge of each of the stratified films 1B, having been separated from the light-transmissible resin film IA, is fed to a main vacuum suction plate 6 along a tension roller 5, as shown in FIG. 2. The upper and lower main vacuum suction plates 6 each have a leading end portion 6D. A static electricity eliminator 18, for removing static electricity from the stratified film 1B, is provided near each of the main vacuum suction plates 6. The plates 6 are vertically movable toward and away from a film adhering position, discussed below. For that purpose, each of the plates 6 is slidably disposed on a guide rail 7 attached to a main vacuum suction support plate 8 which is provided with a rack (not shown). Pinions 10 are rotatably supported by a mounting frame attached to the body frame of the film adhering apparatus. The upper pinion 10 is engaged with rack 9 disposed at the end of a support plate coupling rod 32. The other end of the coupling rod 32 is secured to a coupling rod attachment member 33 which is connected to the lower support plate 8. Lower pinion 10 interconnects the lower support plate 8 to a drive motor 11. Thus, the drive motor 11 drives both the upper and lower support plates 8 in the vertical direction.

A film holding member 12 for holding the stratified film IB at the leading edge thereof is attached to each of the main vacuum suction plate support plates 8 and is slidably disposed on guide rails (not shown) extending in the front-to-rear direction of the film adhering apparatus. A coupling member is provided on each of the film holding members 12. A coupling bar 13 is fitted in the coupling member and is disposed on a fixed cutter support member 14 which supports a fixed cutter 15. A rotary cutter 17 is rotatably supported by a rotary cutter support member 16, and has a cutting edge obliquely extending at a prescribed angle. Air blowing pipes 19 and 20 are provided above and below the rotary cutter support member 16 in order to blow air on the stratified film 1B.

Pressure adhering roller support members 40 are mounted at the central portion of the apparatus above and below the base plate conveyance passage I—I extending in the right-to-left direction of FIG. 2. The shaft of each pressure adhering roller 21 is disposed in the corresponding pressure adhering roller support member 40 at one end thereof. A pneumatic cylinder 41 for moving the upper and the lower pressure adhering rollers 21 up and down is attached to the pressure adhering roller support members 40 at the other ends thereof so as to be disposed therebetween. Wiping rollers 27 for wiping the pressure adhering rollers 21 are supported by pneumatic cylinders 28 near the pressure adhering rollers.

Upper and a lower base plate wiping rollers 30 are supported by support members 29 near the base plate conveyance passage I—I so that the rollers can be moved up and down in conjunction with each other. A pneumatic cylinder 31 for the base plate wiping rollers 30 is attached to the lower base plate wiping roller. A base plate hold-down member 24, including a pneumatic cylinder, is provided downstream of the upper base plate wiping roller 30 in the direction of conveyance of the base plate 22.

The inlet conveyor is provided at the front portion of the body frame of the film adhering apparatus, and includes a plurality of driving conveyance rollers 23A, a plurality of idle conveyance rollers 23B, base plate hold-down members 24B including pneumatic cylinders provided at the front of the inlet conveyor, and wet roller hold-down members 24A including pneumatic cylinders provided in front of the base plate hold-down members.

As shown in FIGS. 1 and 3-7, the right and left frame members 50 of the inlet conveyor are supported by a base portion 51 having casters 52 attached thereto. Additionally, auxiliary caster support members 119R and 119L are secured to the base portion 51 at the right and left sides thereof. Auxiliary caster mounting members 121R and 121L are provided on the auxiliary caster support members 119R and 119L so that the mounting member can be moved backward and forward and be secured in various positions by adjusting crank levers 120. Auxiliary casters 52 are attached to the mounting members 121R and 121L.

Figure 1:
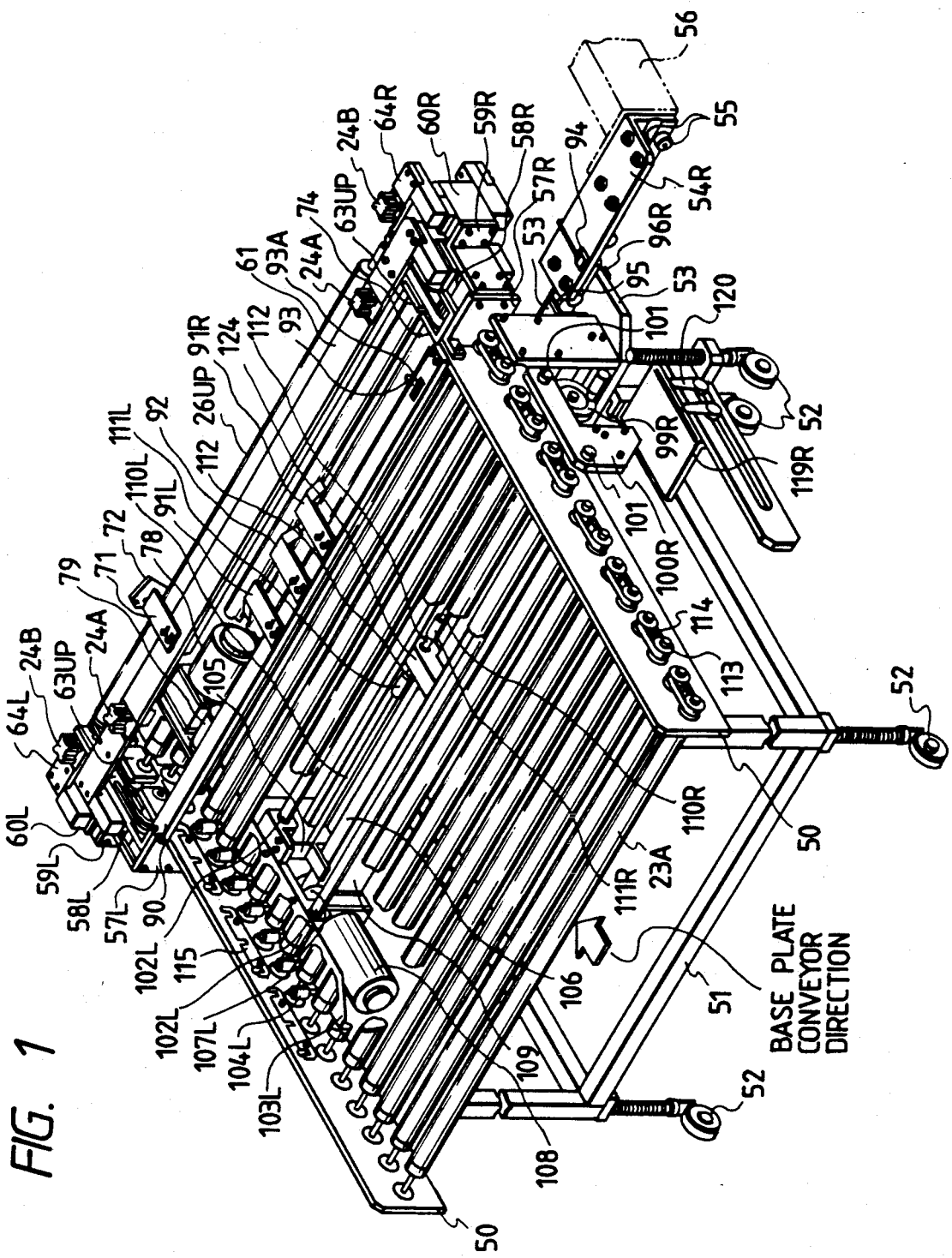
FIG. 1 is a perspective schematic view of an inlet conveyor utilized in an automatic film adhering apparatus according to the present invention and includes a sideward movement mechanism.
Figure 3:
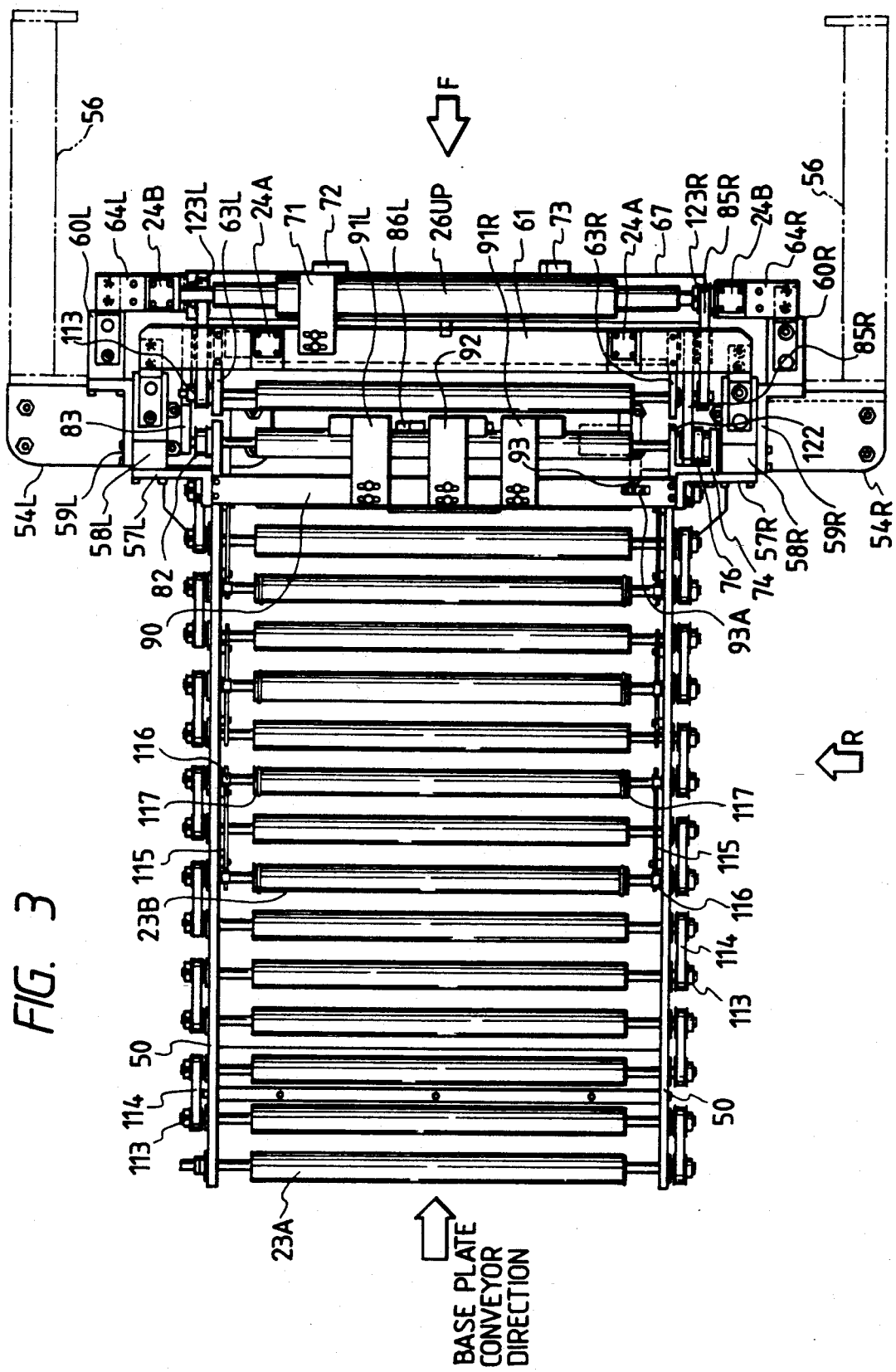
FIG. 3 is a plan view of the conveyor.
Figure 4:
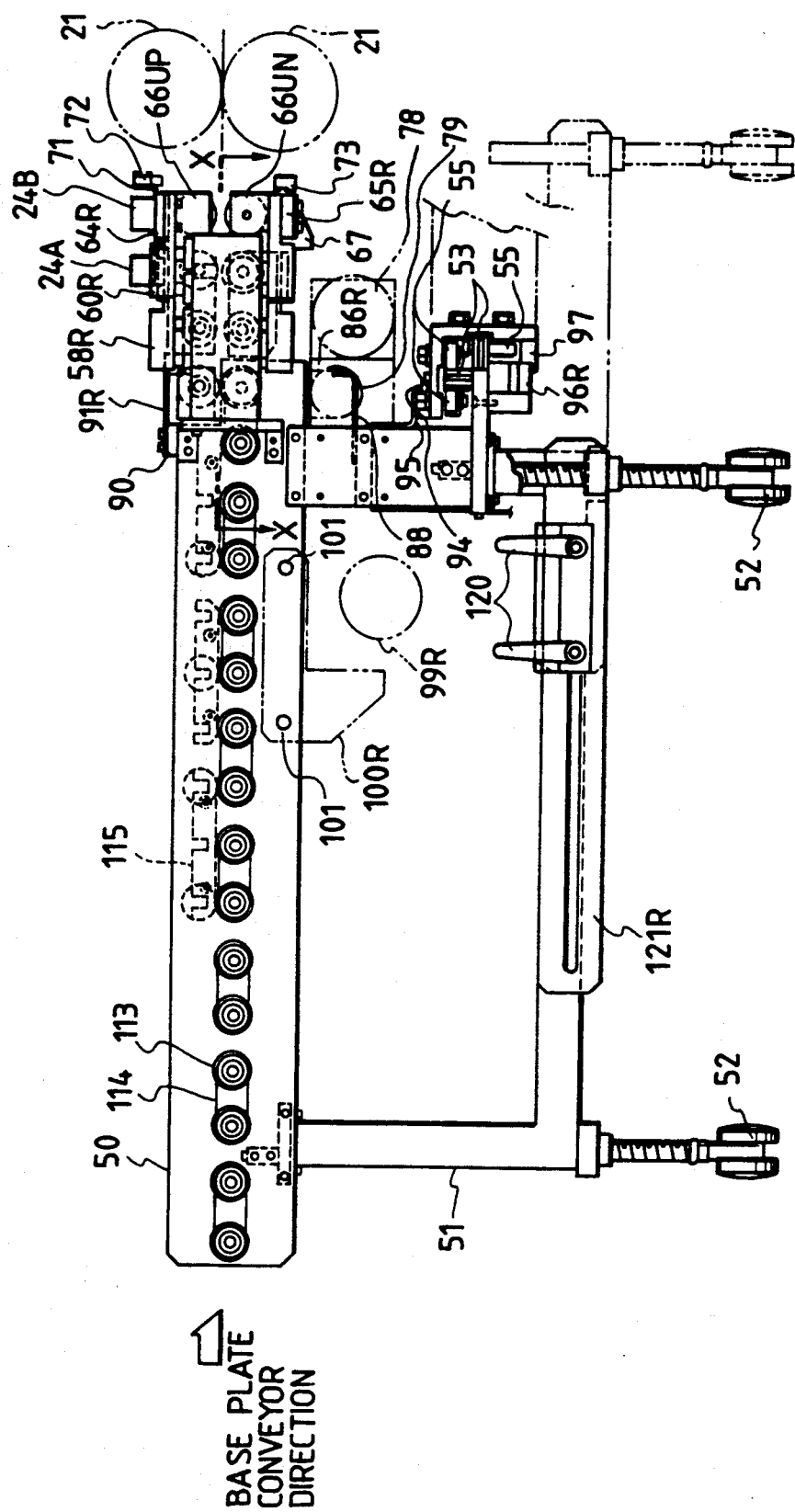
FIG. 4 is a side view of the conveyor as viewed along arrow R in FIG. 3.
Figure 6:
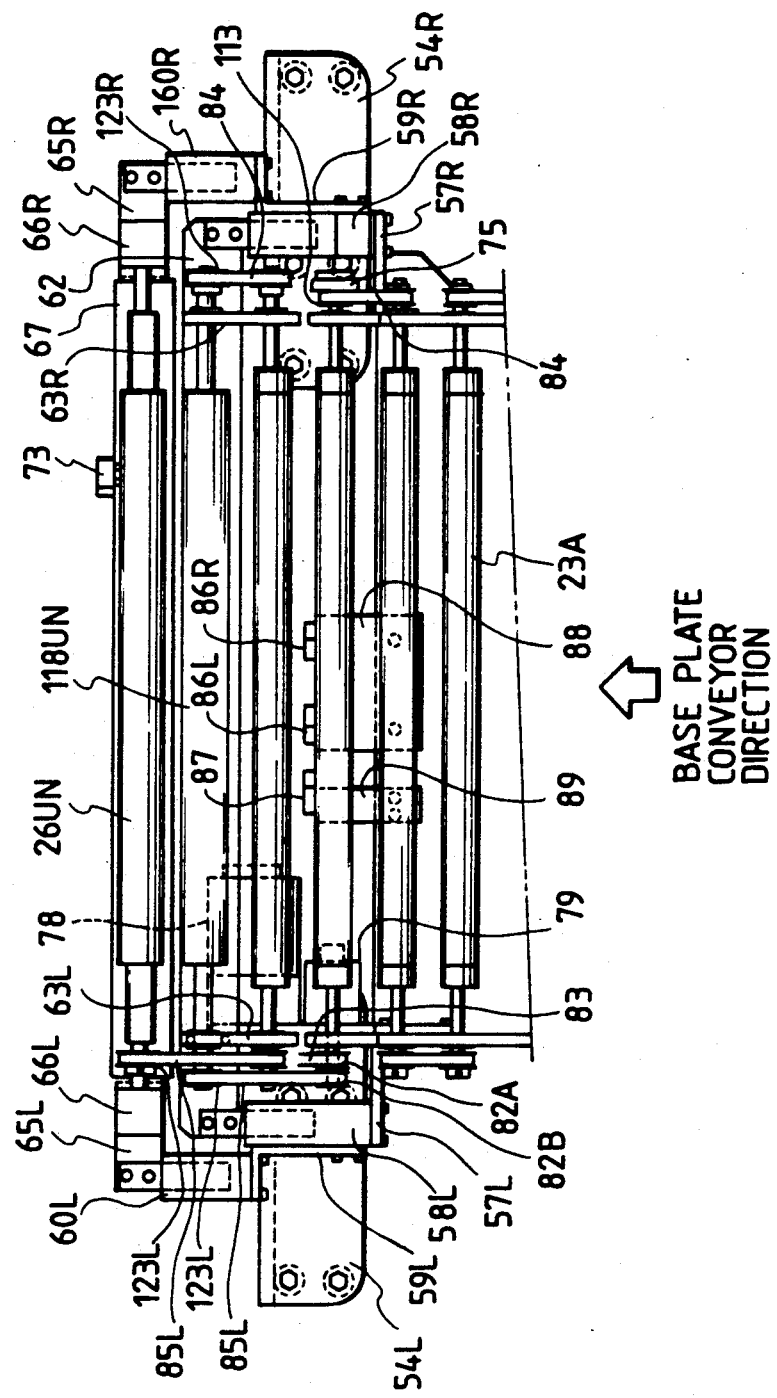
FIG. 6 is a view of the conveyor along line X—X shown in FIG. 4.
Figure 7:
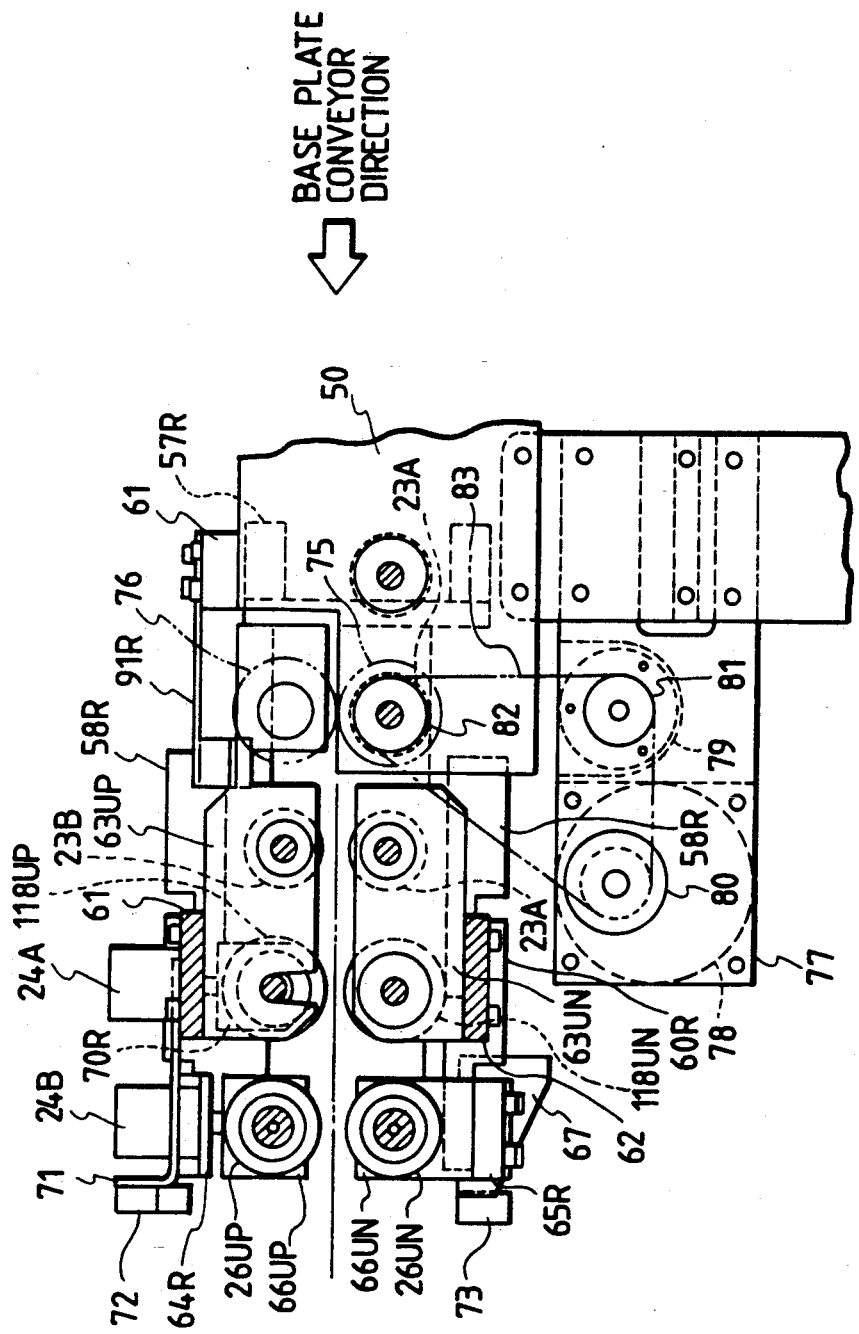
FIG. 7 is a view of the conveyor along line Y—Y shown in FIG. 5.
Figure 8:
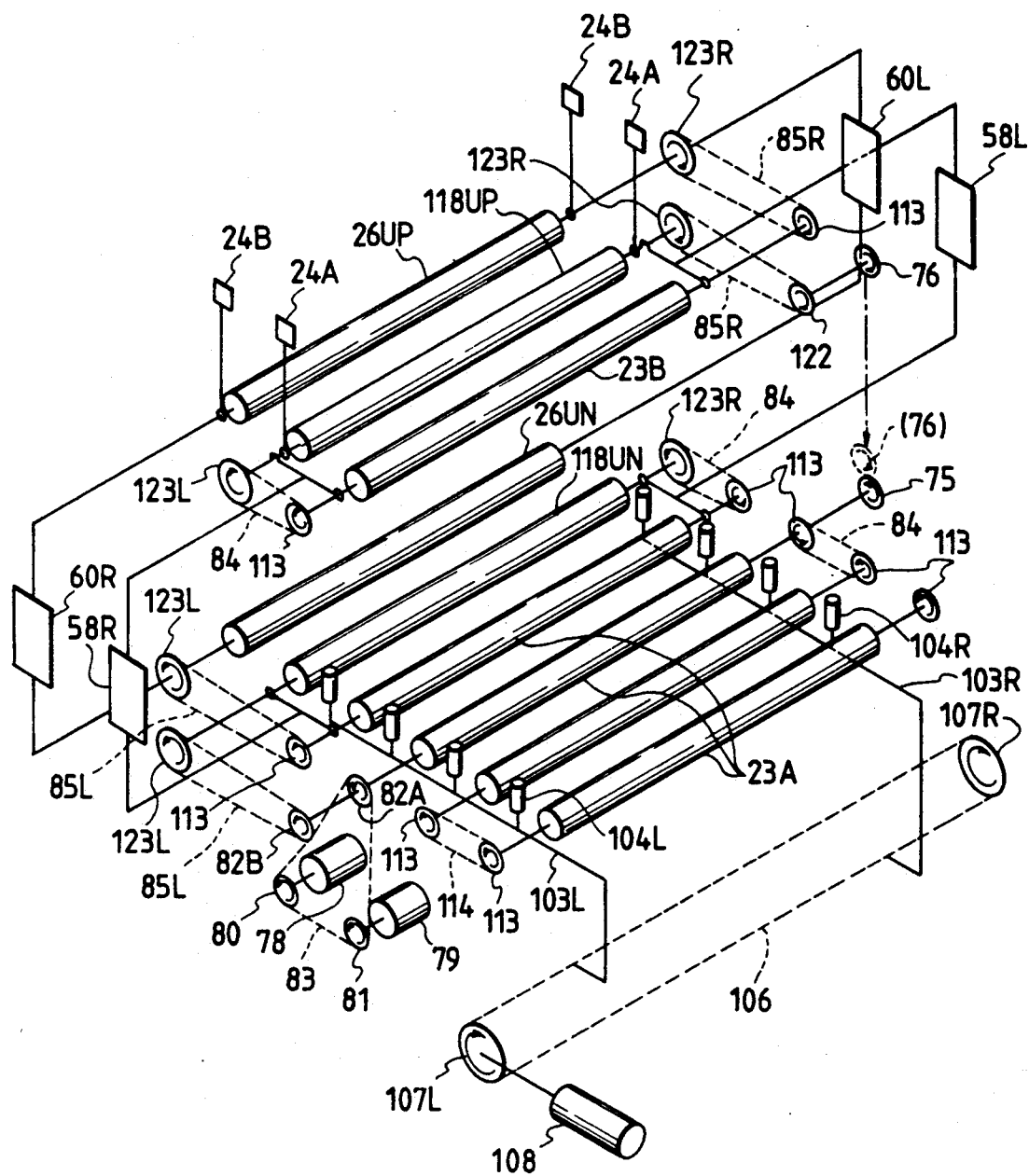
FIG. 8 is a schematic view of the conveyor to illustrate motive power transmission therein.
Figure 9:
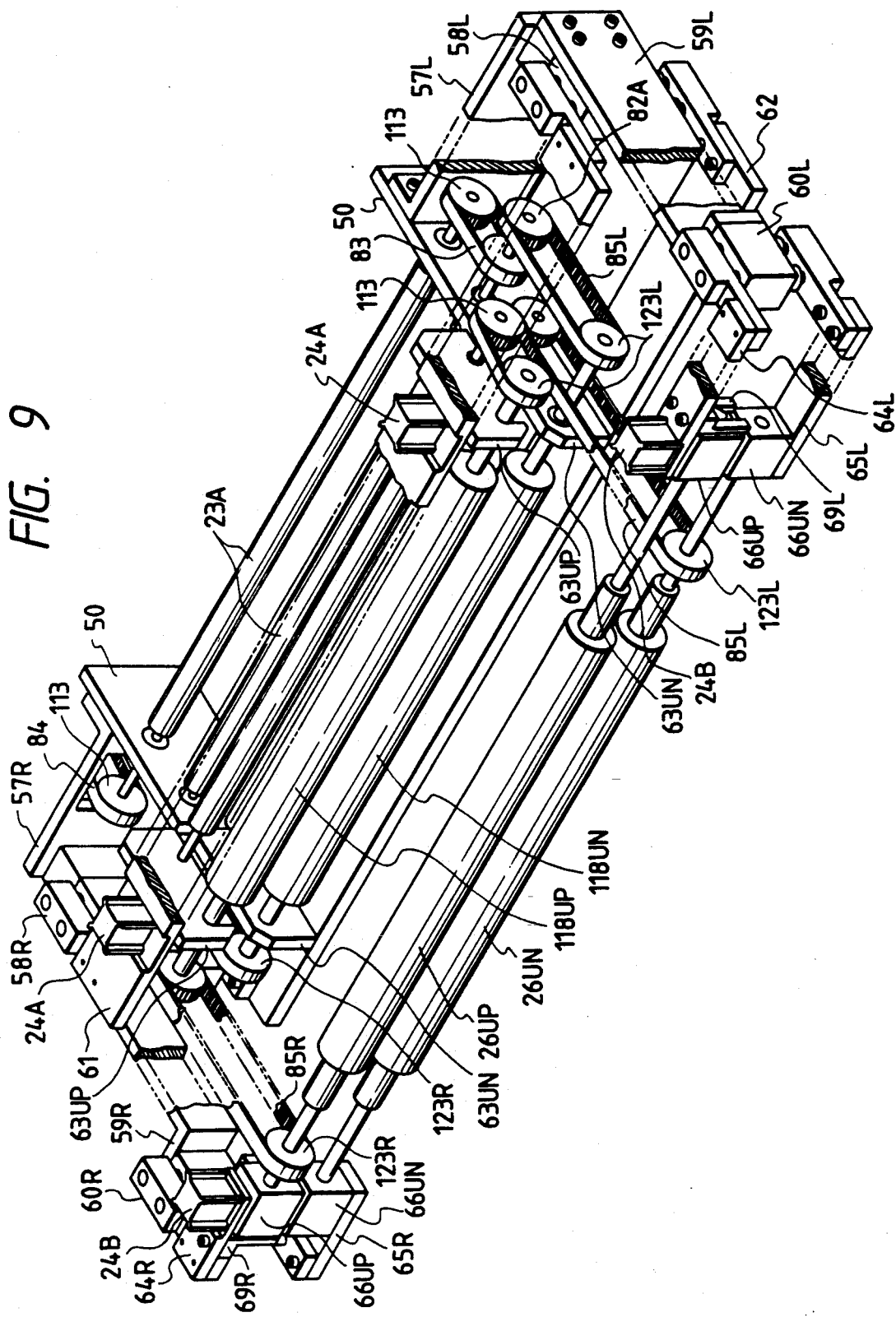
FIG. 9 is an exploded perspective view of the conveyor.

The right and the left frame members 50 have opposing through holes disposed therein. The shafts of the driving conveyance rollers 23A are rotatably supported by bearings disposed in the through holes. As shown in FIGS. 1 and 3, toothed pulleys 113 are mounted on the shafts of the driving conveyance rollers 23A at both ends thereof. The shafts of the rollers 23A are coupled to each other alternately at the right and left ends of the shafts by toothed belts 114 engaged with the toothed pulleys 113, as best illustrated in FIG. 3. Referring to FIG. 7, a toothed pulley 82, denoted by 82A is FIG. 8, is secured to the left end of a shaft of one of the driving conveyance rollers 23A (as seen in the direction of the conveyance of the base plate 22), and is coupled to toothed pulleys 80 and 81 by a toothed belt 83. The pulley 80 is secured to the shaft of a drive motor 78 while the pulley 81 is secured to the shaft of a rotary encoder 79. The motor 78 and the encoder 79 are attached to a drive motor mounting member 77 secured to the frame member 50 of the inlet conveyor. As shown in FIG. 6, a toothed pulley 82B is secured to the shaft of the driving conveyance roller 23A at the left of the other toothed pulley 82A, and is coupled to a toothed pulley 123L by a toothed belt 85. The toothed pulley 123L is secured to the shaft of a rubber roller 118UN at the left end of the shaft as seen in the direction of the conveyance of the base plate. As shown in FIG. 7, the shaft of the driving conveyance roller 23A, on which the toothed pulleys 82 are mounted, is fitted with a gear 75 at the right end of the shaft. A gear 76 is provided over the gear 75 and is engaged therewith. The gear 76 and a toothed pulley 122 are mounted on a shaft rotatably supported with a bearing by a gear support member 74.

Figure 10:
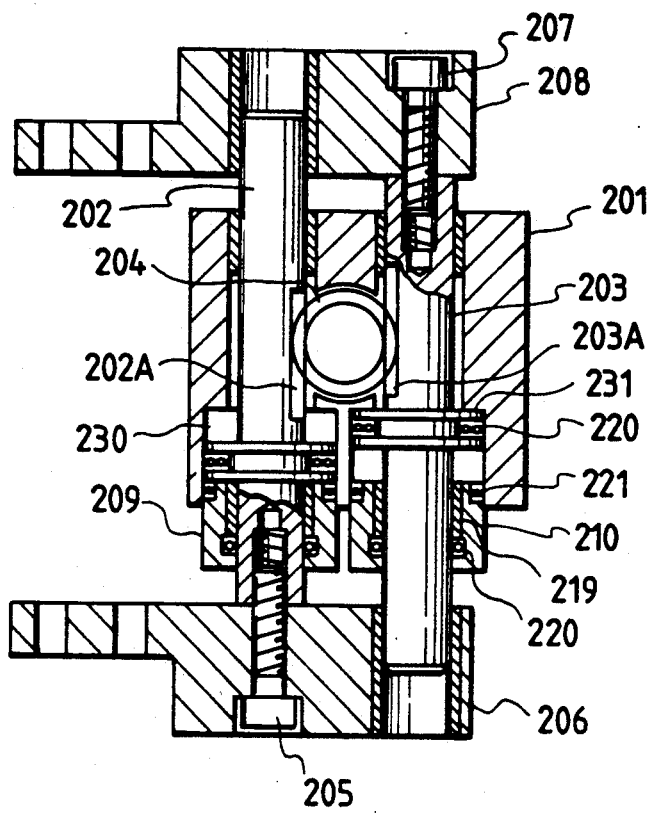
FIG. 10 is a cross-sectional view showing a pneumatic hand of the present invention.

As shown in FIGS. 1, 3, 5-7 and 9, clamping section support members 57R and 57L are respectively attached to the right and left frame members 50 of the inlet conveyor. Pneumatic hands 58R and 58L are also secured to the support members 57R and 57L and have clamping section support members 59R and 59L respectively attached thereto. Pneumatic hands 60R and 60L are secured to the clamping section support members 59R and 59L, respectively. Each of the above-mentioned pneumatic, hands 58R, 58L, 60R and 60L is a rack and piston type, and comprises a main body 201, a pair of piston rods 202 and 203 movable up and down in the main body 201, a pinion 204 accommodated in a central portion of the main body 201 and engaged with both racks respectively formed on inner side portions of the piston rods 202 and 203, a lower hand 206 secured through a bolt 205 to the lower portion of the piston rod 202, an upper hand 208 secured through a bolt 207 to the upper portion of the piston rod 203, and rod covers 209 and 210, as shown in detail in FIG. 10. In FIG. 10, the reference numerals 219, 220 and 221 designate a bearing, a sealing member and an 0-ring, respectively. In this pneumatic hand, if the air is introduced into the left cylinder 230, the upper portion of the piston rod 202 and the lower portion of the piston rod 203 are synchronously retracted into the main body 201 by the virtue of the pinion 204 so that the lower hand 206 and the upper hand 208 are driven to move away from each other. On the other hand, if the air is introduced into the right cylinder 231, the upper portion of the piston rod 202 and the lower portion of the piston rod 203 are synchronously projected from the main body 201 so that the lower hand 206 and the upper hand 208 are driven to move close to each other. A roller support member 62 is secured at both ends thereof to the lower portions of the pneumatic hands 58R and 58L. The base plate holddown members 24A are attached to the right and left portions of the top of the pneumatic cylinder support member 61 which has a sensor mounting plate 71 secured to a central portion thereof. Additionally, roller support members 70 are attached to the rods of the base plate hold-down members 24A. A base plate leading edge sensor 72 is attached to the sensor mounting plate 71.

The shaft of a rubber roller 118UP is rotatably supported with bearings by the right and the left roller support members 70. Roller support members 63UP are secured to the bottom of the pneumatic cylinder support member 61 at both the ends thereof, and have through holes in which the shaft of one of the idle conveyance rollers 23B is rotatably supported with bearings. The roller support members 63UP is provided for depressingly moving the rubber roller 118UP toward the base plate in the clamping action The roller support members 63UP and 63UN are synchronously driven in both sides of the base plate. U-shaped notches are formed on sides of the roller support members 63UP so as to allow the movement of the rubber roller 118UP toward the base plate when the rubber roller 118UP is used as a holding-down roller. the shaft of the rubber roller 118UP is fitted so as to be guided by the notches. Other roller support members 63UN are secured to the top of the roller support member 62 at both the ends thereof. Each of the roller support members 63UN has two through holes in which the shafts of the rubber roller 118 UN and the driving conveyance rollers 23A are respectively rotatably supported with bearings.

Pneumatic cylinder mounting members 64R and 64L are attached to the upper portions of the pneumatic hands 60R and 60L. The hold-down members 24B, including pneumatic cylinders, are secured to the tops of the pneumatic cylinder mounting members 64R and 64L. Wet roller shaft guide members 69R and 69L, having U-shaped notches, are attached to the bottoms of the mounting members 64R and 64L and wet roller support members 66UP are secured to the rods of the hold-down members 24B. Further, the shaft of a wet roller 26UP is rotatably supported by the wet roller support members 66UP and has a toothed pulley 123R mounted on the shaft thereof at the right end of the shaft, as seen in the direction of conveyance of the base plate 22. The wet roller 26UP is coupled to a toothed pulley 113 by a toothed belt 85R, as shown in FIG. 3. The toothed pulley 113 is mounted on the shaft of one of the idle conveyance rollers 23B.

Wet roller support members 65R and 65L are attached to the lower portions of pneumatic hands 60R and 60L. Additional wet roller support members 66UN are secured to the tops of the wet roller support members 65R and 65L for rotatably supporting the shaft of wet rollers 26UN. Wetting liquid reception dish mounting plates 68, to which a wetting liquid reception dish 67 is secured at both ends thereof, are attached to the wet roller support members 65R and 65L. A base plate leading edge sensor light reflector 73 is attached to the dish 67 near the central portion thereof. A toothed pulley 123L is mounted on the shaft of the wet roller 26UN at the left end of the shaft, as seen in the direction of conveyance of the base plate 22, and is coupled to a toothed pulley 113 by a toothed belt 85L. The toothed pulley 113 is mounted on the shaft of one of the driving conveyance rollers 23A.

A reflector mounting plate 90 is secured at both ends thereof to the tops of the right and left frame members 50 of the inlet conveyor near the clamping section support members 57R and 57L. A base plate sideward movement sensor light reflector 91R, a base plate trailing edge sensor light reflector 92 and a base plate sideward movement sensor light reflector 91L are attached to the central portion of the top of the reflector mounting plate 90, and located in a right position, a central position and a left position, respectively, as seen in the direction of conveyance of the base plate 22. Graduations 93A, for indicating the movement of a sideward movement center indication plate 93 attached to a sideward movement pole, are provided on the reflector mounting plate 90 at the right end thereof.

Figure 5:
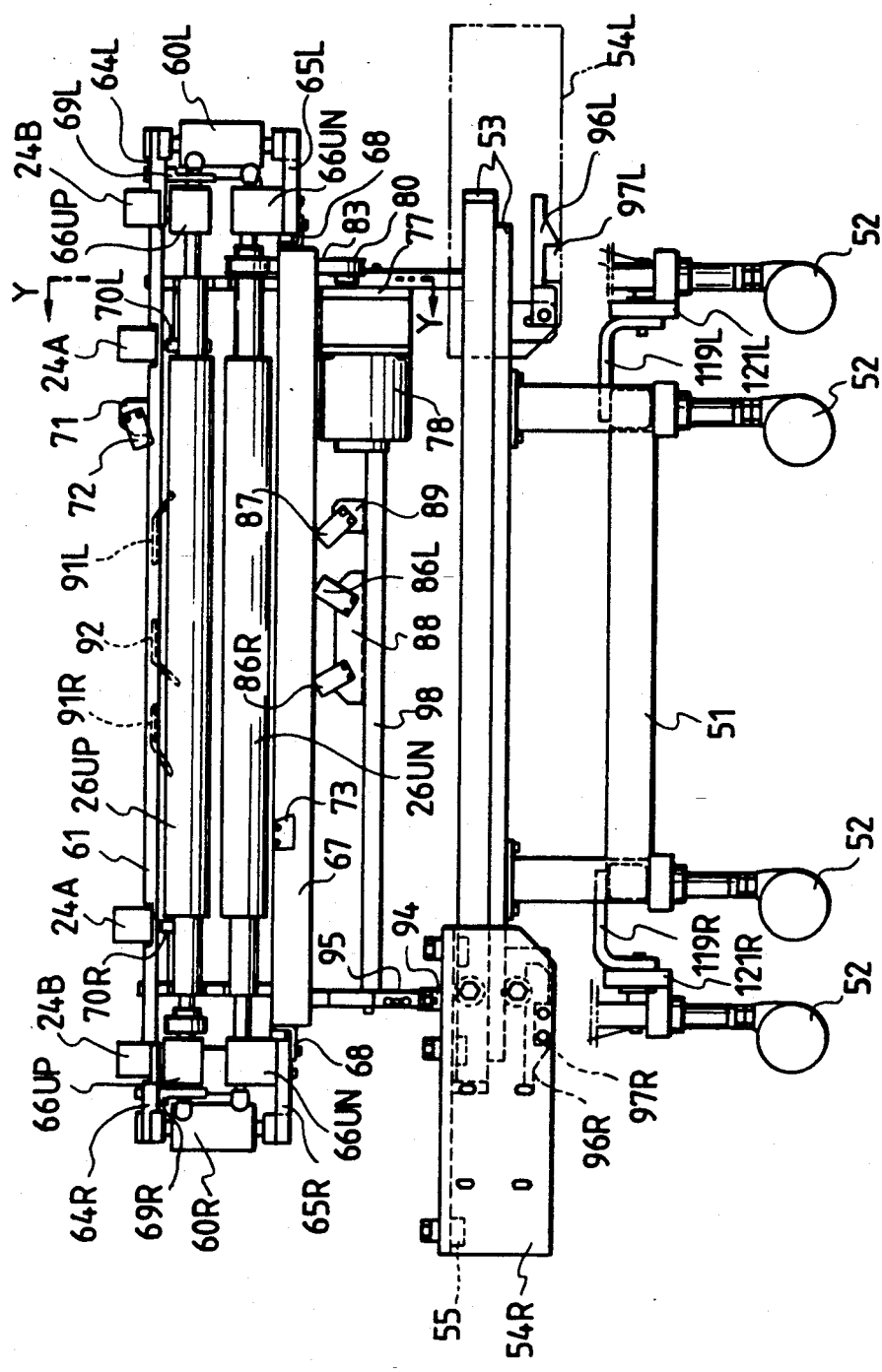
FIG. 5 is a view of the conveyor as viewed along arrow F shown in FIG. 3.

As shown in FIG. 5, a support member mounting plate 98 is secured at both ends thereof to the frame members 5 of the inlet conveyor near the drive motor 78. Further, sensor support members 88 and 89 are attached to the mounting plate 98 at the central portion thereof and sideward movement sensor 86R and 86L and a base plate trailing edge sensor 87 are disposed on the sensor support members 88 and 98.

As shown in FIGS. 1, 3, 4 and 5, slide bases 54R and 54L are secured to the right and left members 56 of the body frame of the film adhering apparatus and include a plurality of cam followers 55. Positioning members 97R and 97L are secured to the slide bases 54R and 54L and a conveyor positioning sensor 94 is attached to the top of the slide base 54R. A detection plate 95 for the conveyor positioning sensor 94 is disposed under the right frame member 50 of the inlet conveyor and a guide plate 53 is attached to the base portion 51 of the inlet conveyor. Hooks 96R and 96L are provided under the guide plate 58 at both the ends thereof.

As shown in FIG. 1, each of the frame members 50 of the inlet conveyor has two through holes under the central driving conveyance rollers 23A into which shafts 101 are slidably fitted. A right shaft support member 100R and a left shaft support member (not shown), are secured to the shafts 101 at both ends thereof. A sideward movement drive section support member 109 is secured to the shaft support member 100R and a sideward movement drive motor 108 is provided at the left of the support member 109, as seen in the direction of conveyance of the base plate 22, and is fitted with a toothed pulley 107L. Another toothed pulley, denoted by 107R in FIG. 8, is rotatably supported to the right of the support member 109 and is coupled to the toothed pulley 107L by a toothed belt 106.

Right linear bushings (not shown) and left linear bushings 102L are slidably fitted on the shafts 101. A right fixed member (not shown) and a left fixed member 105 are provided on the linear bushings 102R and 102L at one end of each of the fixed members, and are attached at the other ends thereof to the upper and lower portions of the toothed belt 106, respectively.

A centering block 124 is secured to the sideward movement drive section support member 109 at the central portion thereof, and has a through tapped hole in which a centering screw 112 is engaged. Coupling shafts 110R and 110L are connected at one end to the centering screw 112 by couplings 111R and 111L. A sideward movement center positioning right handle 99R and a sideward movement center positioning left handle 99L (not shown) are attached to the coupling shafts 110R and 110L at the other ends thereof. The coupling shafts 110R and 110L are secured, near the handles 99R and 99L, to the frame members 50 of the inlet conveyor by support members (not shown). Right and left sideward moving pole support members 103R and 103L are fitted with right and left sideward moving poles 104R and 104L and are secured to the tops of the right and the left linear bushings 102R and 102L, respectively. The right sideward moving pole support member 103R and the right sideward moving poles 104R are not shown in the drawings.

The operation of the inlet conveyor for conveying the base plate 22 is described below with reference to FIG. 8. When the film adhering apparatus is in automatic operation, the drive motor 78 is rotated counter-clockwise, as viewed in FIG. 8, so that motive power is transmitted to the toothed pulley 81, on the shaft of the rotary encoder 79, and the toothed pulley 82A, on the shaft of the driving conveyance roller 23A, through the toothed belt 83. Since the driving conveyance roller 23A is thus rotated, motive power is sequentially transmitted through the other toothed pulleys and the other toothed belts so that all the driving conveyance rollers 23A are rotated. Motive power is similarly transmitted to the rubber roller 118UN and the wet roller 26UN. Since the gear 75 on the driving conveyance roller 23A provided with the toothed pulley 82A is engaged with the other gear 76, motive power is transmitted to the toothed pulley 122 secured to the same shaft as the latter gear so that the idle conveyance roller 23B, the rubber roller 118UP and the wet roller 26UP, which are coupled to each other by the toothed pulleys and the toothed belt, are rotated.

Additionally, the base plate 22 is placed into the inlet conveyor from a preceding process so that the base plate is conveyed by the driving conveyance rollers 23A. When the base plate 22 is detected by either of the sideward movement sensors 86R and 86L, a detection signal is generated so that the sideward movement drive motor 108 is rotated clockwise, as viewed in FIG. 8. As a result, motive power is transmitted through the toothed pulley 107 and the toothed belt 106 so that the base plate 22 is moved rightward or leftward by the sideward moving poles 104 secured to the sideward moving pole support member 103. The base plate 22 is thus centered.

A first counter (not shown) is caused by the detection signal to start counting the number of pulse signals from the rotary encoder 79. When the counted number reaches a set value, compressed air is sent to the base plate hold-down members 24A and the wet roller hold-down members 24B, which are pneumatic cylinders, so that the base plate 22 is held down by the rubber roller 118UP and the wet roller 26UP. In this state, the lower rubber roller 118UN and the wet roller 26UN are securely positioned at the same level in the upward and downward direction as the driving roller 23A of the inlet conveyor. This represents easily positioning of the base plate in the tentative adhesion of the film onto the base plate before the pressure adhesion thereof. When the leading edge of the base plate 22 is detected by the base plate leading edge sensor 72, a detection signal is generated so that a second counter (not shown) starts counting the number of pulse signals from the rotary encoder 79. When the number counted by the second counter has reached a set value, the drive motor 78 is stopped so that the conveyance of the base plate 22 is ceased. Simultaneously, the upper and the lower main vacuum suction plates 6 of the film adhering apparatus, which are shown in FIG. 2, begin to move toward the base plate 22 to tentatively adhere the stratified films 1B to the base plate, under pressure. At the start of movement of the suction plates 6, a first timer (not shown) is activated. When the set time of the timer has elapsed, the upper and the lower main vacuum suction plates 6 are moved away from the base plate 22. A signal generated as a result of such movement activates the pneumatic hands 58R, 58L, 60R and 60L into clamping action. Simultaneously, the compressed air is discharged from the base plate hold-down members 24A and the wet roller hold-down members 24B to stop holding the base plate 22. This is because the clamping of the base plate by the pneumatic hands can be easily performed in a next step. Since the pneumatic hands 58R, 58L, 60R and 60L are activated, the base plate 22 is clamped by the upper and lower rubber rollers 118UP and 118UN, the driving and the idle conveyance rollers 23A and 23B and the upper and the lower wet rollers 26UP and 26UN, which are shown in FIG. 8, so that the center of thickness of the base plate on the conveyance plane of the inlet conveyor is moved to a clamping center located at a prescribed height, regardless of the thickness. The inlet conveyor and other portion of the film adhering apparatus are installed in advance so that the center of thickness of the base plate 22 is automatically positioned at the prescribed height, regardless of the thickness of the plate, as mentioned above.

If an air bubble preventive agent is not applied to the base plate 22, the upper and the lower wet rollers 26UP and 26UN are controlled to not clamp the base plate so that they are not unnecessarily worn. The clamping of the base plate 22 by the components of the inlet conveyor may be performed through control before the stratified films 1B are tentatively adhered to the base plate by the upper and the lower vacuum suction plates 6. When the trailing edge of the base plate 22 is detected by the base plate trailing edge sensor 87, a signal is generated so that a second timer (not shown) is activated. When the set time of the second timer has elapsed, the pneumatic hands 58R and 58L are returned to their original positions. Also, when the passing of the trailing edge of the base plate 22 is detected by the base plate leading edge sensor 72, a signal is generated so that the pneumatic hands 60R and 60L are returned to their original positions.

Next, an embodiment in which the present invention is applied to the film peeling apparatus disclosed in U.S. Pat. No. 4,770,737, is briefly described hereinafter with reference to the drawings.

Figure 12:
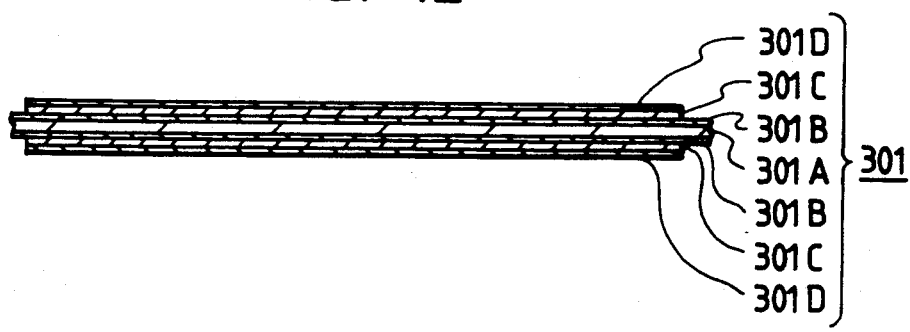
FIG. 12 is a cross-sectional view showing a base plate used for a printed circuit board before films applied thereon are peeled by the film peeling apparatus.

FIG. 12 is a cross-sectional view showing a base plate 301 used for a printed circuit board.

As shown in FIG. 11, a conveying mechanism for the base plate 301 in the peeling apparatus is mainly comprised of conveying drive rollers 302 for conveying the printed circuit board 301. Along a conveyance passage A—A in the conveying mechanism, disposed are film end raising means 303 of the vibration pen type, air blowing means 304, peeling angle setting plates 305 assisting the peeling of the films and film conveying-out means 306. As shown in FIG. 12, an insulative member 301A of the base plate 301 is formed on both sides or one side thereof with conductive layers 301B made of copper or the like. Stratified film members having light sensitive resin layers 301C and light transmissible resin films (protective films) are pressure-adhered onto the conductive layers 301B. The light sensitive film 301C has already processed by the exposure with the films having prescribed wiring patterns, applied thereon. As shown in FIG. 11, the base plate 301 is conveyed by conveying drive rollers 302 in a direction shown by an arrow A (a base plate conveyance direction) along the base plate conveyance path A—A. A holding-down and clamping device 310 according to the present invention is provided in a space defined by the dive roller 302 of the inlet conveyor and the peeling angle setting plates 305 and the film conveying-out means 306. In FIG. 11, reference numeral 302A designates a pinch roller. Reference numerals 307A and 307B designate peeled film accommodating containers for accommodating the films conveyed out from the base plate in directions shown in arrows M and 0, respectively. Other constructions and operations with respect the film peeling apparatus are disclosed in detail in the U.S. Pat. No. 4,770,737, so that detailed explanation thereof is omitted.

The operation of a film processing apparatus which includes an inlet conveyor according to the present invention and is a film adhering or peeling apparatus is summarized as follows:

(1) The leading edge of a base plate in the direction of the conveyance thereof is detected. The base plate is moved sideward in response to a leading edge detection signal. After that, the base plate is held down and moved by a prescribed length in the direction of conveyance of the plate. The base plate is then automatically moved up or down to be disposed midway between the processing units of the film processing apparatus. The center of the thickness of the base plate can thus be automatically positioned midway between the processing units, regardless of the thickness.

(2) In a case where the film processing apparatus is a film adhering apparatus, in a process in which the base plate is held down and moved by the prescribed length in the direction of the conveyance of the plate a film can be tentatively adhered to the base plate, the base plate is automatically moved up or down to be midway between the processing units, and the film is gradually adhered to the base plate while the plate is being moved in the direction of the conveyance thereof. For that reason, the film can be adhered to the base plate without causing a wrinkle in the film and an air bubble between the film and the base plate.

(3) In a case where the film processing apparatus is a film peeling apparatus, after the base plate is held down and moved by the prescribed distance in the direction of conveyance thereof and the base plate is automatically moved up or down to be midway between the processing units, a film can be gradually peeled from the base plate while the plate is being moved in the direction of conveyance thereof. For that reason, the film can be securely peeled from the base plate.

(4) The films can be adhered to or peeled from both the sides of the base plate in order to heighten the efficiency of the processing of the films.

(5) The inlet conveyor, which conveys the base plate to a prescribed position by rollers while moving the base plate sideward, includes a base plate hold-down means which is rotatable and which is for holding down the base plate after the sideward movement thereof, and a base plate positioning means for automatically causing the base plate to be disposed midway between the processing units as the base plate remains held down by the hold-down means. For that reason, the position of the base plate can be automatically adjusted to coincide with the midpoint distance between the processing units, regardless of the thickness.

(6) The base plate positioning means includes a base plate pinching means for moving the base plate up or down to that of the distance be disposed midway between the processing units and pinching the base plate on both the sides thereof. For that reason, the center of the thickness of the base plate can be adjusted to coincide with that of the midpoint between the upper and lower film processing units of the apparatus and photoresist films can be precisely adhered to both sides of the base plate under the same conditions for each side.

(7) Wet rollers, consisting of spongy rollers for applying an air bubble preventive agent to both sides of the base plate, can clamp the base plate in a manner similar to the base plate positioning means. If a process in which the air bubble preventive agent is not applied to the base plate is selected, the wet rollers are prevented from clamping the base plate and thereby prevented from being unnecessarily worn by the base plate.

The present invention is not confined to the embodiment described above, but may be embodied or practiced in other various ways without departing from the spirit or essential character of the invention.

What is claimed is:

1. A base plate conveying apparatus for conveying a base plate in a first direction and introducing said base plate from an inlet conveyor to a processing unit, said inlet conveyor conveying said base plate based on one surface of said base plate and said processing unit processing said base plate on the basis of a midplane in the thickness direction of said base plate extending in a second direction transverse to said first direction, said apparatus comprising:

base plate holding means for holding said base plate positioned on said inlet conveyor; and base plate position correcting means for clamping said base plate from both sides thereof and for moving said base plate in said second direction so as to coincide said midplane of said base plate with a center of said processing unit.

2. The apparatus according to claim 1, wherein said base plate holding means includes a holding roller for holding said one surface of said base plate, and a cylinder for depressingly moving said holding roller toward said one surface of said base plate.

3. The apparatus according to claim 2, wherein said holding roller is a rubber roller having tracking function.

4. The apparatus according to claim 1, wherein said base plate position correcting means includes at least a pair of nip rollers for clamping said base plate, synchronously driving means for synchronously, depressingly moving said nip rollers from both sides of said base plate toward said base plate.

5. The apparatus according to claim 4, wherein said base plate holding means includes a holding roller for holding said one surface of said base plate, and at least one of said nip rollers serves for said holding roller.

6. The apparatus according to claim 5, wherein said at least one nip roller serving for said holding roller is disposed at a side of said processing unit.

7. The apparatus according to claim 5, wherein said at least one nip roller serving for said holding roller is depressed onto said base plate positioned on said inlet conveyor, and then all of said nip rollers are depressingly, synchronously moved onto, said base plate to coincide said midplane of said base plate with said center of said processing unit while decreasing a depressing force of said at least one nip roller serving for said holding roller.

8. The apparatus according to one of claims 5 to 7, wherein said base plate position correcting means further includes roller supporting members for supporting said nip rollers and synchronously moving said nip rollers to clamp said base plate, and said base plate holding means further includes notches formed on said roller supporting members for allowing a movement of said at least one nip roller toward said base plate when said at least one nip roller holds said base plate.

9. The apparatus according to claim 4, wherein said synchronously driving means includes a pneumatic hand of a rack and pinion type.

10. The apparatus according to one of claims 2 and 4, wherein said holding roller and said nip rollers are rotated by a belt having teeth.

11. The apparatus according to claim 1, wherein a deviation of said center of said processing unit from said one surface of said base plate positioned on said inlet conveyer is greater than a deviation of said midplane of said base plate positioned thereon from said one surface of said base plate positioned thereon.

12. The apparatus according to claim 1, further comprising:
base plate sideward moving means positioned at an upstream of said inlet conveyor relative to said base plate holding means for moving said base plate in a width direction thereof and positioning said base plate in a prescribed position suitable for holding said base plate by said base plate holding means.

13. The apparatus according to claim 1 wherein said processing unit simultaneously processes both surfaces of said base plate.

14. The apparatus according to one of claims 1 or 13, wherein said processing unit is a film adhering apparatus having a pressure adhesion rollers for pressure-adhering films onto both surfaces of said base plate.

15. The apparatus according to claim 14, further comprising:
void preventing agent application means for applying a void preventing agent onto both surfaces of said base plate before said films are pressure-adhered onto both surfaces of said base plate.

16. The apparatus according to one of claims 1 or 13, wherein said processing unit is a film peeling apparatus for peeling films adhered onto said base plate therefrom.

* * * * *